United States Patent [19]

Yoshimasu

[11] Patent Number: 5,065,117
[45] Date of Patent: Nov. 12, 1991

[54] MICROWAVE CIRCUIT

[75] Inventor: Toshihiko Yoshimasu, Soraku, Japan

[73] Assignee: Sharp Kabushiki Kaisha, Osaka, Japan

[21] Appl. No.: 533,576

[22] Filed: Jun. 5, 1990

[30] Foreign Application Priority Data

Jun. 6, 1989 [JP] Japan ................................. 1-143528
Oct. 23, 1989 [JP] Japan ................................. 1-275257

[51] Int. Cl.$^5$ .............................................. H03H 7/38
[52] U.S. Cl. ..................................... 333/33; 333/263; 333/204; 330/286
[58] Field of Search ...................... 333/32, 33, 34, 35, 333/204, 205, 246, 247, 263; 330/277, 286, 302–307; 455/327

[56] References Cited

U.S. PATENT DOCUMENTS

| 4,320,353 | 3/1982 | Sasaki | 330/286 |
| 4,525,680 | 6/1985 | Pan et al. | 333/277 |
| 4,618,838 | 10/1986 | Kajiwara et al. | 333/263 X |
| 4,754,229 | 6/1988 | Kawakami et al. | 333/32 X |

FOREIGN PATENT DOCUMENTS

| 0125102 | 7/1984 | Japan | 333/204 |
| 0246101 | 12/1985 | Japan | 333/204 |
| 0146006 | 7/1986 | Japan | 330/286 |

OTHER PUBLICATIONS

"Narrow-Band Microstrip Bandpass Filters with Low Radiation Losses for Millimeter-Wave Applications", Pertti K. Ikalainen and George L. Matthaei, IEEE Transactions on Microwave Theory and Techniques, vol. 36, No. 3, Mar. 1988, pp. 514–521.

Primary Examiner—Eugene R. Laroche
Assistant Examiner—Seung Ham
Attorney, Agent, or Firm—David G. Conlin; Robert F. O'Connell

[57] ABSTRACT

Disclosed is a microwave circuit suitable made into a monolithic microwave integrated circuit (MMIC). This microwave circuit includes a main line comprising a distributed constant line formed on a major surface of a substrate, and a stub connected in parallel with the main line in which lines the characteristics admittance varies discontinuously. Because of the discontinuous variation of the characteristic admittance of the stub, the phase of the characteristic admittance is changed, so that the stub length can be reduced.

3 Claims, 10 Drawing Sheets

MICROWAVE CIRCUIT

BACKGROUND OF THE INVENTION

1. Field of the Invention

The present invention relates generally to microwave circuits having distributed constant lines each formed on a major surface of a substrate, and more particularly, to a microwave circuit suitably made into a monolithic microwave integrated circuit.

2. Description of the Background Art

Figure 11:
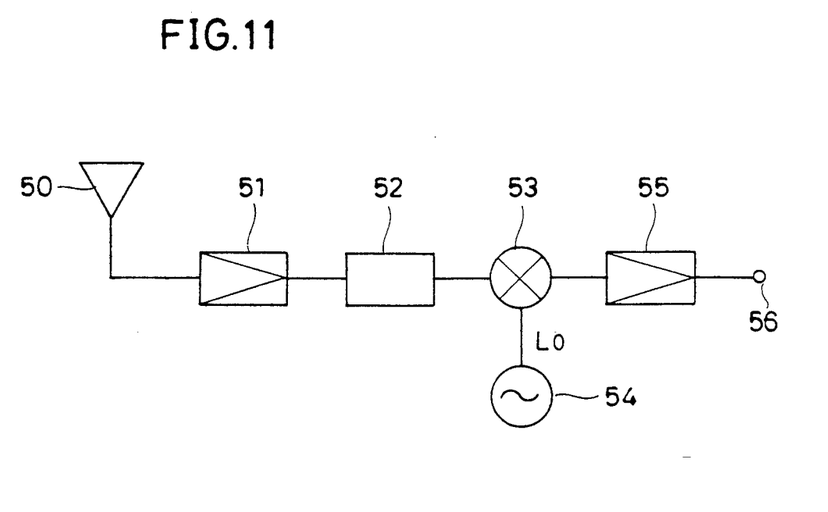
FIG. 11 is a block diagram showing a conventional receiver for SHF band direct satellite broadcast.

FIG. 11 is a block diagram of a conventional receiver for SHF (Super High Frequency) band direct satellite broadcast (12 GHz band). This receiver comprises an antenna 50, a high frequency low noise amplifier 51, a band pass filter or an image band-stop filter 52, a mixer 53, a local oscillator 54, an intermediate frequency amplifier 55 and an intermediate frequency output terminal 56. A signal received by the antenna 50 is amplified by the high frequency low noise amplifier 51 and thereafter is inputted to the mixer 53, wherein the signal is mixed with a local oscillator signal Lo from the local oscillator 54 and then converted into a signal of the intermediate frequency. The filter 52 in such circuit structure attenuates a signal in the image frequency band which is the problem in mixing.

The above described conventional circuit of FIG. 11 is formed by a MIC (Microwave IC) circuit having circuit devices such as transistors, diodes or the like disposed on dielectric substrates and connected through microstrip lines. A half-wavelength parallel coupled line filter using microstrip lines is often used as the filter circuit 52.

In recent years, field effect transistors and HEMTs using GaAs and InP have been developed because GaAs and InP have mobility of electrons five or six times as large as that of Si, and furthermore various attempts have been made in many places to make such transistors and matching circuits, bias circuits or the like monolithic. The monolithic IC of this type is referred to as MMIC (Monolithic Microwave IC) which is more compact and has excellent reliability as compared with the conventional MIC circuits. Thus, it is reported that MMIC is applied to such a low noise amplifier and a mixer for receiving SHF band direct satellite broadcast.

A transmission line for use in an MMIC includes a microstrip line, a coplanar line and the like. The microstrip line is formed by forming a main line out of a gold conductor on a major surface of a semiconductor substrate having a conductive ground electrode on its back surface. The coplanar line has ground electrodes and a main line formed on a major surface of a semiconductor substrate.

Figure 12:
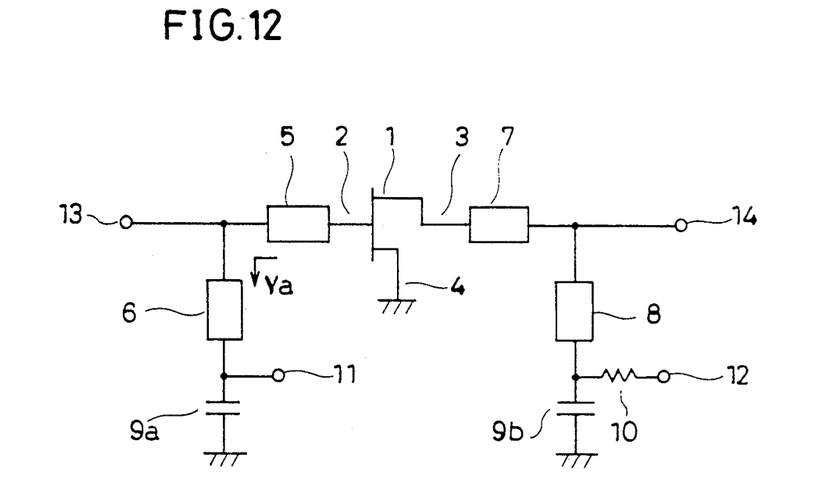
FIG. 12 is a circuit diagram of a conventional high frequency amplifier made into an MMIC.

FIG. 12 shows a GaAs low noise amplifier MMIC for directly receiving a satellite broadcast (12 GHz band) as an example of a conventional microwave circuit having distributed constant lines on a major surface of a semiconductor substrate.

This MMIC comprises an input terminal 13 to which microwave is inputted, FET1 for amplifying a microwave signal with low noise, an input main line 5 connected between the input terminal 13 and a gate 2 of the FET1, an input matching stub 6 with one end thereof connected to the input terminal 13 and a termination grounded through a capacitor 9a, a bias terminal 11 for biasing a gate of the FET1 connected to a termination of the input matching stub 6, an outputting main line 7 connected to a drain 3 of the FET1, an outputting stub 8 with one end connected to the outputting main line 7 and a termination grounded through a capacitor 9b, a drain biasing terminal 12 connected to a termination of the outputting stub 8 through a bias resistor 10 and an output terminal 14 connected to the outputting main line 7.

The above-described FET1 is set to have a gate length of 0.25 μm and a gate width of 200 μm, which structure is common for use in the 12 GHz. In a case of using such as FET, in order to set the input/output impedance of the MMIC to 50Ω, the characteristic impedances of the transmission lines 5, 6, 7 and 8 are set in the range from 30 to 120Ω, requiring about 10°-70° of an electrical length $\theta$ ($\theta = 2\pi la/\lambda$) at 12 GHz. This length expressed in terms of a physical length l will be about 0.2-1.7 mm.

Since in an MMIC, a circuit for matching input and output impedances of an FET is ordinarily formed by distributed constant lines using microstrip lines or the like, lines of a length of the order of a millimeter are required at a frequency of about 10 GHz. Moreover, since the MMIC is formed on a semiconductor substrate of GaAs or the like, it is very difficult in terms of a chip size to form a long line of the order of a millimeter.

Figure 13:
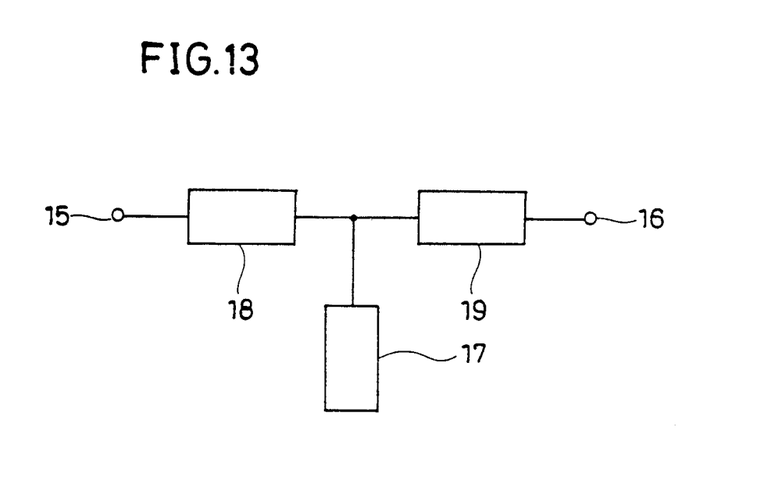
FIG. 13 is a circuit diagram of a conventional band removing filter made into an MMIC.

Now, shown in FIG. 13 is a conventionally reported example of a MMIC band-stop removing filter for use with SHF band direct satellite broadcast receiver. This filter comprises input and output terminals 15 and 16, main lines 18 and 19, and a stub 17 with one end connected to a point where the main lines 18 and 19 are connected and an open termination. The stub 17 is designed to have an electrical length $\theta$ ($\theta = 2\pi l/\lambda$, expressed in terms of a physical length) which is ¼ wavelength at the center frequency (fr) of a stop-band and a characteristic admittance Y17 to be 0.02 mho. Both of the characteristic admittances Y18 and Y19 of the main lines 18 and 19 are 0.02 mho.

Figure 14:
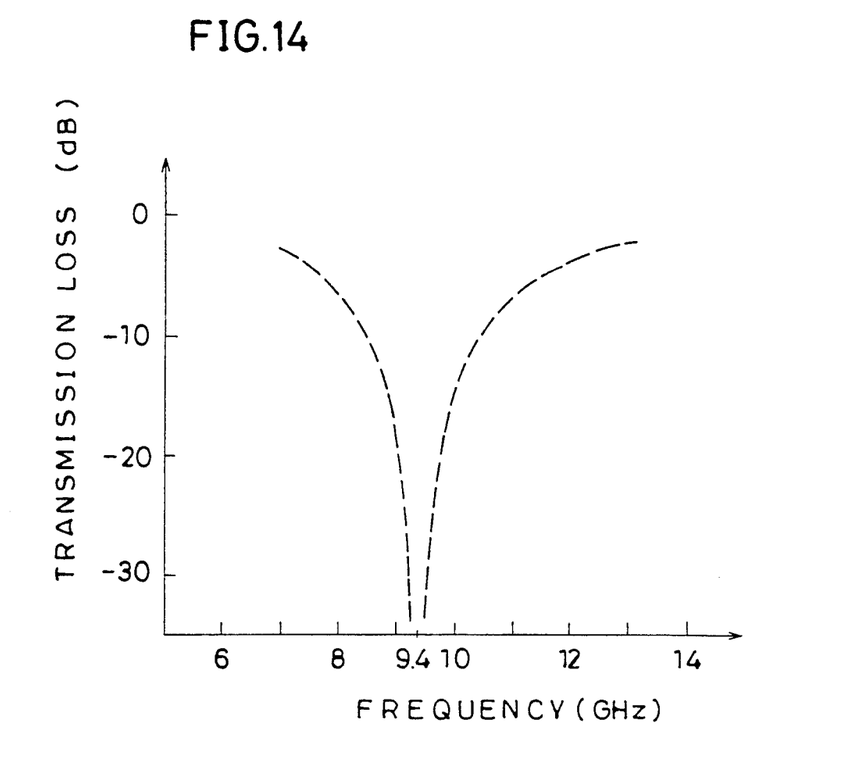
FIG. 14 is a transmission characteristic diagram of the above described conventional band removing filter.

The signal pass band of the SHF band direct satellite broadcast including those in the United States, Japan and Europe ranges from about 11.7 to 12.2 GHz and oscillator frequency is about 10.7 GHz, so that an intermediate frequency fr, of the image band will be about 9.4 GHz. In this case, if GaAs is used for a substrate of MMIC of FIG. 13, a physical length of about 2.8 mm is required for the stub 17. Now, shown in FIG. 14 is a calculation of the transmission loss in the above-described MMIC filter circuit, assuming that Y17=Y18=Y19=0.02 mho and the physical length of the stub is 2.8 mm wherein the terminals 15 and 16 are supposed to terminate at 50Ω. FIG. 14 shows that the transmission loss at the center frequency fs of 12GHz in the signal pass band is about 4dB, and a band wherein a signal removal ratio of −20dB can be obtained is at about 600 MHz.

However, in the case of an image band-stop filter circuit for use with the SHF band direct satellite broadcast receiver an MMIC is structured using conventionally proposed distributed constant lines, such as microstrip lines or the like and, a stub length becomes as long, as above, about 2.8 mm as, so that it is difficult to make the circuit as an MMIC. In addition, there is a problem that transmission loss in the signal pass band (11.7-12.2 MHz) is as great as about 4dB.

SUMMARY OF THE INVENTION

Therefore, one object of the present invention is to provide a MMIC in which a stub length can be reduced.

Another object of the present invention is to reduce a length of a stub for matching input and output impedances of a microwave circuit.

Yet another object of the present invention is to provide an MMIC filter having a small transmission loss in a signal pass band.

Briefly stated, the present invention is directed to a microwave circuit comprising a distributed constant line which is to be a main line on a major surface of a substrate, and a stub the characteristic admittance of which varies at least more than one point.

In such a structure, the characteristic admittance of the stub connected in parallel with the main line varies discontinuously, so that a plurality of characteristic admittance values exist, as seen from the main line to the other end of the stub. Accordingly, for example, a condition of open admittances can be fixed by selecting the plurality of admittance values, wherein the plurality of admittance values can be set such that the stubs are made shorter.

In addition, a filter of the microwave circuit is structured by using distributed constant circuits and includes a main line and stubs connected in parallel thereto. Characteristic admittances of the main line and the stubs are varied discontinuously.

According to the above described structure, the characteristic admittance of the main line discontinuously varies, whereby loss in a signal pass band can be reduced. In addition, the characteristic admittances of the stubs connected in parallel to the main line also vary discontinuously. Since phases of the characteristic admittances discontinuously vary as the characteristic admittances of the stubs vary, the stub length can be reduced more than in the conventional example. As above, by varying characteristic admittances discontinuously, a MMIC band-stop removing filter circuit can be achieved having a stub length shorter than that of the conventional example and a small transmission loss in the signal pass band.

Furthermore, the filter of the microwave circuit includes a main line comprising a distributed constant circuit, a stub with an open end connected in parallel thereto and a capacitor connected in parallel to the main line. The characteristic admittance of the stub is discontinuously varied such that a characteristic admittance of an open end side is larger than a characteristic admittance of the other side.

The above described filter, because a capacitor is connected to a main line, allows transmission loss in a signal pass band to be reduced.

Accordingly, designing of a high frequency circuit is facilitated to accelerate making the high frequency circuit an MMIC.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
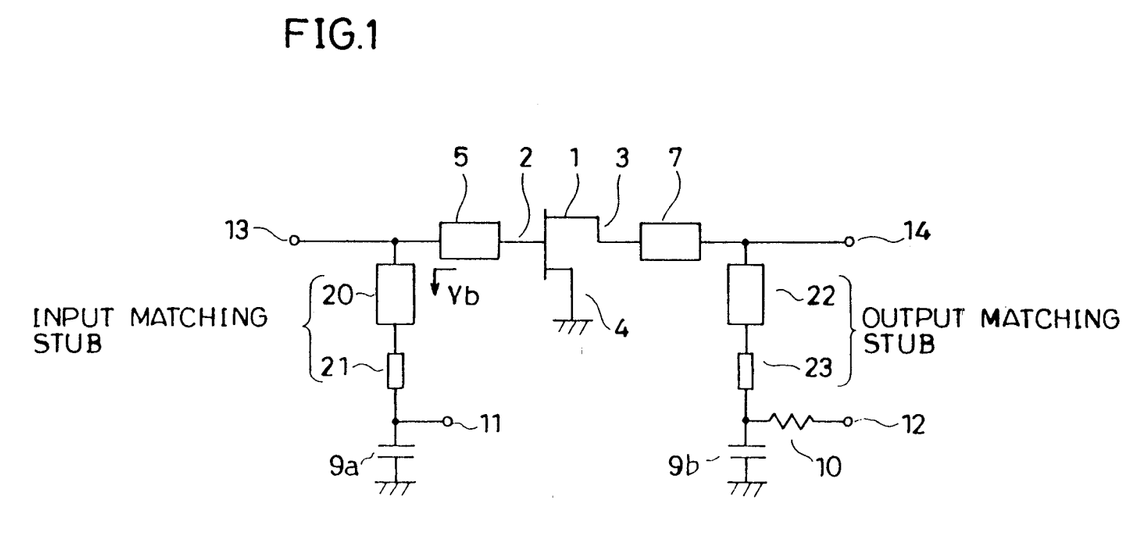
FIG. 1 is a circuit diagram of a low noise amplifier according to a first embodiment of the present invention.

FIG. 1 shows a circuit diagram of a low noise amplifier of a microwave circuit according to one embodiment of the present invention. The same portions herein as those of the conventional example shown in FIG. 12 are allotted the same reference numerals and therefore no further description thereof will be given for FIG. 1. Referring to FIG. 1, it differs from the conventional example of FIG. 12 in that there are provided stubs 20 and 21 for matching the input of the FET1 connected to the main line 5 for the input circuit and output matching stubs 22 and 23 connected to the main line 7 for the output circuit. The present embodiment is characterized in that the conventional matching stubs 6 and 8 (FIG. 12) are formed into the input matching stubs 20 and 21 and the output matching stubs 22 and 23 whose characteristic admittances are respectively varied such that the characteristic admittance of the stub 20 on the FET1 side becomes larger than that of the stub 21 on the ground side, and also the characteristic admittance of the stub 22 on the FET1 side becomes larger than that of the stub 23 on the ground side. In the case where the thickness of each substrate is the same, the characteristic admittance of a stub becomes larger as width thereof is increased. As above, if a matching circuit is structured by stubs each with a grounded end, stub lengths can be made shorter than those of a conventional example by discontinuously varying a characteristic admittance of each stub and making the characteristic admittances of the stubs nearer to the main line (20, 22) larger. This will be described in more detail when comparing the circuit of FIG. 1 with the conventional example.

First, taking the short stub 6 of FIG. 12 as an example, an admittance Ya seen from the input terminal 13 to the capacitor 9a will be represented as follows:

$$Ya = \frac{Y0 \times (Y1 + jY0 \times \tan\theta)}{Y0 + jY1 \times \tan\theta} \quad (1)$$

wherein
Y0: characteristic admittance of the stub 6
Y1: admittance of a load
θ: electrical length of the stub 6
l: physical length of the stub 6
λ: wavelength in a line
Since $\pi = 2\pi l/\lambda$, $Y1 = \infty$, the following equation will be obtained.

$$Ya = Y0/(j \cdot \tan\theta) \ldots (2)$$

As is clear from the equation (2), Ya is a pure imaginary number. Accordingly, if a real number part of an admittance (Yin) seen from the terminal 13 to the FET1 side excluding the stub 6 is 20 mυ, an input impedance of the MMIC can be matched to 50Ω by cancelling an imaginary number part of the Yin by the stub 6. If the imaginary number part of the Yin is supposed to be Ym, a matching condition will be represented by the following equation.

$$Ya = -Ym \ldots \quad (3)$$

Thus, the characteristic admittance Y0 and the electric length θ of the stub are fixed. However, in case a transmission line is formed on a semiconductor substrate of GaAs or the like, a choice of the characteristic admittance Y0 is limited, so that the electric length θ is practically fixed by the equations (2) and (3). Since ordinarily about 10°-70° of the electrical length θ is required, when an operating frequency of the MMIC is approximately 12 GHz, a physical length of a stub becomes as large as 0.2-1.7 mm resulting in an inability to use an MMIC configuration.

Figure 2:
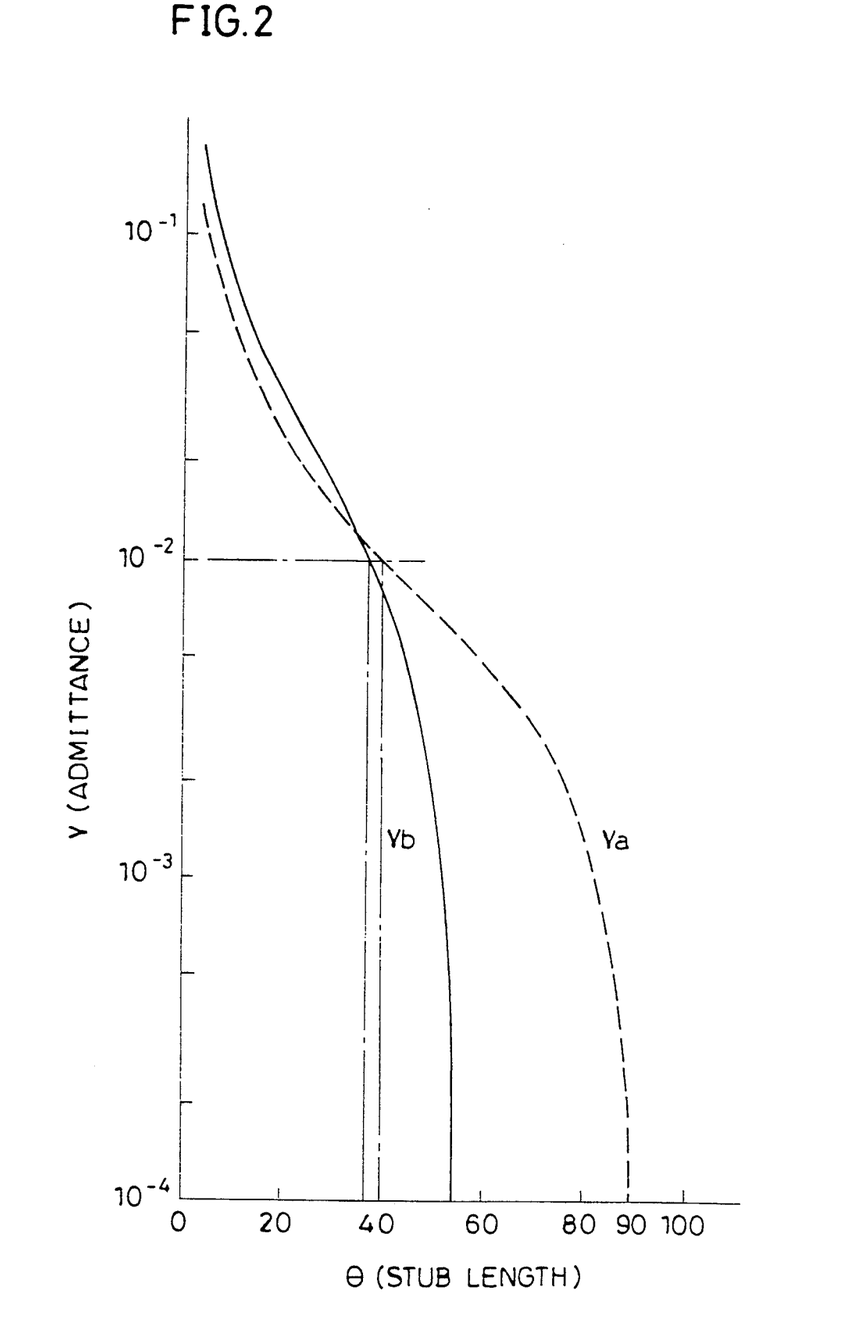
FIG. 2 is a diagram showing a relation between an electrical length and an admittance of a stub.

Now taking the stubs 20 and 21 according to the embodiment shown in FIG. 1 as examples, an admittance Yb seen from the terminal 13 to the capacitor 9a will be represented as follows:

$$Yb = \frac{jYy \times (Yy \times \tan\theta y - Yx \times \cot\theta x)}{Yy + Yx \times \cot\theta x \times \tan\theta y} \quad (4)$$

wherein Yx and Yy denote the characteristic admittances of the stubs 21 and 20, respectively and θX and θy denote the By fixing the characteristic admittances so that Yx<Yy in the equation (4), a stub length (θ+θy) for obtaining the same admittance can be made shorter than a stub length (θ) of the conventional example in a region where the admittance Yb is small (that is, θx and θy are large). For the purpose of simplicity, shown in FIG. 2 are a calculation of the admittance Yb and the electrical length θ (=θx+θy) according to the present embodiment and a calculation of the admittance Ya and the electrical length θ according to the conventional example shown in the equation (2), assuming $\theta x = \theta y = \theta/2 \ldots (5)$ and Y0=Yx=1/120, Yy=1/30.

As is clear from FIG. 2, when Y is large and the stub length is short, an electrical length (θ) of the stub required to obtain the same admittance Y is approximately equal in the conventional example (Ya) and the present embodiment (Yb), and when Y becomes smaller and a larger stub is required, the required length of the present embodiment according to the invention can be made shorter than that of the conventional one. Furthermore, the present embodiment produces more effective when the stub requires an increased length. For example, as indicated by a dotted line in FIG. 2, when Ym= −0.01, while a stub length of the conventional example (Ya) is 40°, that of the present embodiment (Yb) is about 38°, which is not so much shorter. On the contrary, when Ym=0, while the stub length of the conventional example is 90°, that of the present embodiment is 54°, which is shorter by 40%.

The stub length =90° in the conventional example is a value for which a solution of the equation (2) is 0, in other words, a value at which the stub is made open. In the present embodiment, the solution of the equation (4) needs to be 0 to make the stub open, that is, the equation "Yy × tan θy − Yx × cotθx=0" needs to be satisfied. Substituting in the above described equation θx=θy= θ/2, this equation will be expressed as:

$$\theta = 2\tan^{-1}\sqrt{Yx/Yy}$$

wherein if Yy>Yx, the electrical length θ of the stub becomes a small value. This small value is achieved by two characteristic admittances Yx and Yy of different values (that is, the stub has different characteristic admittances). More than three characteristic admittances may be provided, the number thereof not being limited to two. As above, according to the present embodiment, it is possible to form a long stub in the MMIC, which is difficult to achieve in a conventional MMIC.

While in the above-described conventional example, the end of the stub is grounded by the capacitor, the capacitor is not necessarily required for the ground but a wire such as gold may be used.

While the foregoing is an example of a short stub with an end thereof grounded, the present invention can be applied to a so-called open stub with an open end. A brief description will be given in the following for the case of an open stub, which is basically the same as the above-described short stub.

Figure 3:
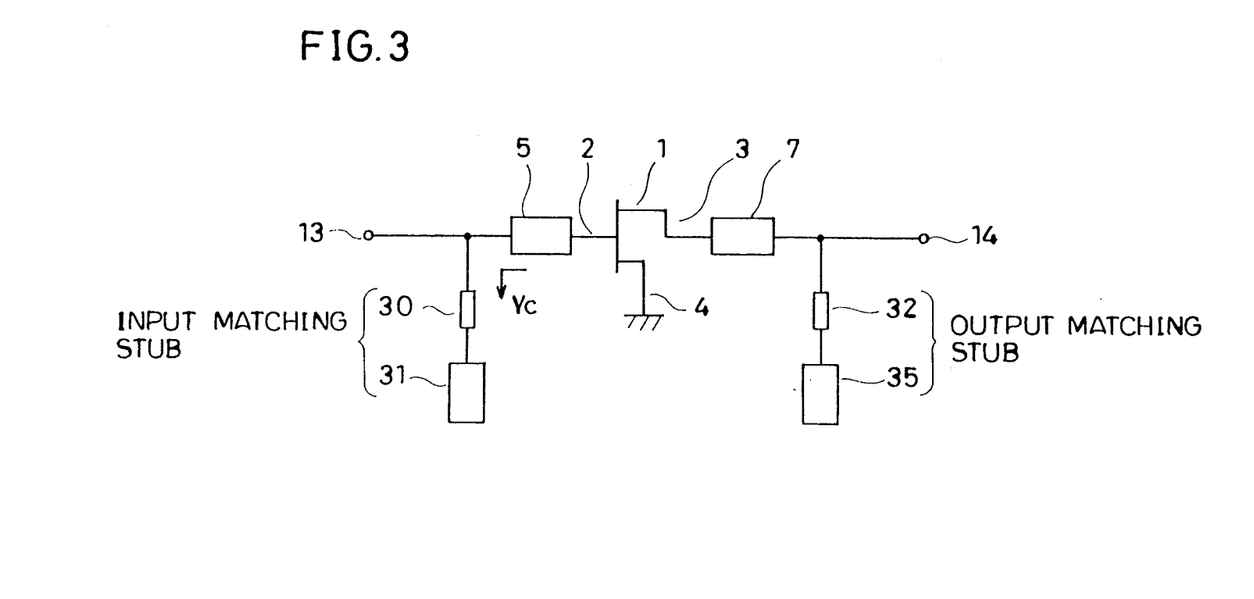
FIG. 3 is a circuit diagram of a low noise amplifier according to a second embodiment of the present invention.

An embodiment in this case is shown in FIG. 3. With reference to FIG. 3, this embodiment differs from the above-described embodiment shown in FIG. 1 in that the characteristic admittances of the stubs 30 and 32 nearer to the main line are made smaller than those of the stubs 31 and 33 with open terminations. In the open stubs, a load admittance Y1=0, so that from the equation (1), an admittance Yc seen from the terminal 13 to stubs 30 and 31 will be represented as follows:

$$\frac{jYyy \times (Yxx \times \tan\theta xx + Yyy \times \tan\theta yy)}{Yyy - Yxx \times \tan\theta xx \times \tan\theta yy} \quad (6)$$

wherein Yxx and Yyy denote characteristic admittances of the stubs 30 and 31 and θxx and θyy denote electrical lengths of the stubs 31 and 30, respectively.

In the above described equation (6), by introducing a relation of Yyy<Yxx between the characteristic admittances of the stubs 31 and 30, the same relation between the admittance Yc and the electrical length θ (=θxx+θyy) will be obtained as that of FIG. 2 shown in the embodiment of the above described equation (4), wherein in a region where the admittance Y in MMIC is large (a region wherein a stub length θ is large), the stub length can be reduced more in the present embodiment (Yc) than in the conventional example (Ya).

As above, a stub length required for matching can be reduced by 40% less than the stub length required for a conventional circuit formed by uniform stub lines by: (1) making the characteristic admittances of the stub lines nearer to the main line (20 and 22 of FIG. 1) larger than those of the grounded stub lines (21 and 23 of FIG. 1) when the matching circuit is structured by stubs each having a grounded end, and (2) making the characteristic admittances of the stub lines nearer to the main line (30 and 32 of FIG. 3) smaller than those of the open stub lines (31 and 33 of FIG. 3) when the matching circuit is structured by stubs each having an open end. Accordingly, a long stub, which is difficult to realize in a conventional MMIC, can be achieved according to the present invention. While the characteristic admittance varies only at one point in the stub in this embodiment, it can be varied at more than two points.

As above, according to the present invention, the stub length required for obtaining the same admittance can be drastically reduced as compared with a conventional one, thereby easily achieving a matching circuit using MMIC of a small chip size to expand the utilization of a microwave circuit, as well as to reduce disadvantages in designing the circuit. In addition, the reduced stub length makes it possible to miniaturize and integrate the microwave circuit.

Figure 4:
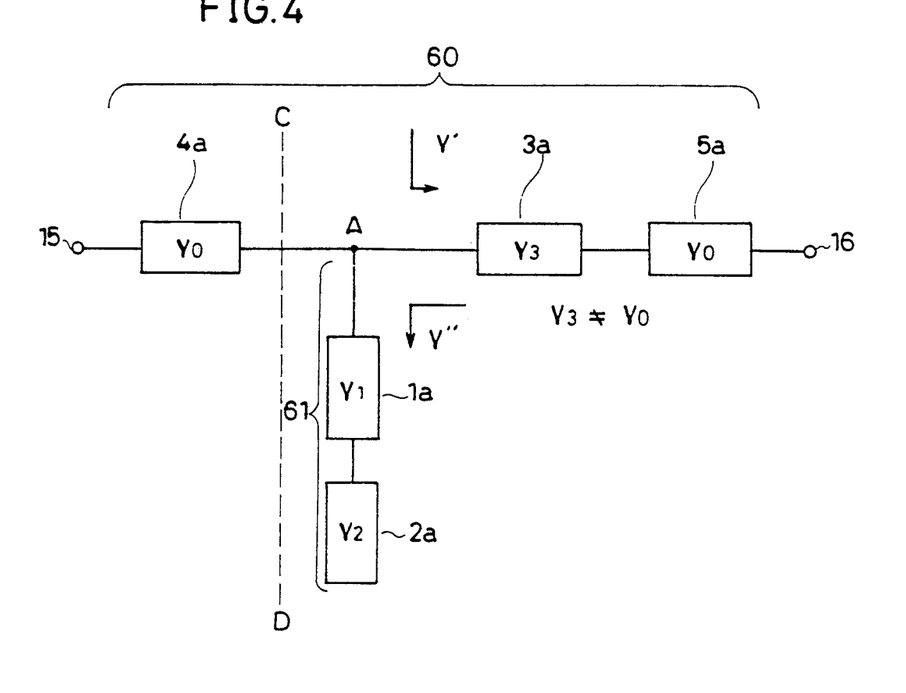
FIG. 4 is a circuit diagram of a filter according to a third embodiment of the present invention.

FIG. 4 is a circuit diagram of a filter according to a third embodiment of the present invention. Referring to FIG. 4, this filter comprises an input terminal 15, an output terminal 16, a first distributed constant line 60 being connected between the input terminal 15 and the output terminal 16 and having a characteristic admittance discontinuously varying at two points, and a second distributed constant line 61 being connected to a point A at which the characteristic admittance of the first distributed line 60 varies discontinuously (referred to as a node A hereinafter) and having an open termination. The first distributed constant line 60 comprises a main line 4a connected to the input terminal 15, a main line 5a connected to the output terminal 16 and a main line 3a connected between the main line 4a and the main line 5a. The second distributed constant line 61 comprises a line 1a on the node A side of the first distributed constant line 60 and a line 2a with an open termination both having 1a and 2a being used as stubs.

The input terminal 15 may be used as an output terminal and the output terminal 16 may be used as an input terminal.

Assuming that characteristic admittances of the stubs 1a, 2a and the main line 3a are denoted as Y1 and Y2 and Y3, respectively, and the characteristic admittances of the main lines 4a and 5a are denoted as Y0 (=0.02 mho), the relation of the characteristic admittances Y1, Y2 and Y3 is set to be Y1 < Y2 and Y3 ≠ Y0.

In the MMIC band-stop filter circuit according to the present embodiment, when an intermediate frequency (fs) of a signal pass band is higher than an intermediate frequency (fr) of a stop-band (fs>Fr), it can be shown that Y3>Y0. On the contrary, when the center frequency (fs) of the signal pass band is lower than the center frequency (fr) of the stop-band (fs<fr), the characteristic admittance of the main line is set to have a relation that Y3<Y0. By setting the characteristic admittances Y1, Y2 and Y3 of the respective distributed constant lines as described above, the effect of attenuating microwave signals in a predetermined band can be obtained with a stub of a shorter length as compared with a conventional one, and a MMIC filter circuit can be achieved wherein a transmission loss in the signal pass band is reduced.

The MMIC filter circuit according to the present embodiment will be described in more detail.

When the input and output terminals 15 and 16 terminate at 50Ω, an admittance Y' seen from the node A between the stub 1a and the main line 3a to the main line 3a will be represented as follows;

$$Y' = \frac{Y3 \times (Y0 + jY3 \times \tan\theta 3)}{Y3 + jY0 \times \tan\theta 3} \quad (7)$$

In addition, an admittance Y" seen from the node A to the stub 1a will be represented as follows:

$$Y'' = \frac{jY1 \times (Y2 \times \tan\theta 2 + Y1 \times \tan\theta 1)}{Y1 - Y2 \times \tan\theta 1 \times \tan\theta 2} \quad (8)$$

wherein $\theta 1$, $\theta 2$ and $\theta 3$ denote electrical lengths of the lines 1a, 2a and 3a of FIG. 4, respectively, and it can be shown that:

$$O\theta = 2 \times \pi \times \ln/\lambda n \ldots \quad (9)$$

wherein ln and λn denote a physical length of a line n (n = 1, 2, 3) and a wavelength in the line.

Accordingly, the admittance Y seen from the line C–D to the lines 1a and 3a of FIG. 4 will be represented as follows:

$$Y = Y' + Y'' = \text{Re}(Y) + \text{Im}(Y) \ldots \quad (10)$$

and, thus, while the real number part Re (Y) of Y will be represented as follows:

$$Re(Y) = \frac{Y0 \times Y3^2 \{1 + (\tan\theta 3)^2\}}{Y3^2 + Y0^2 \times \tan^2\theta 3} \quad (11)$$

the imaginary number part Im (Y) of Y will be represented as follows:

$$Im(Y) = \frac{Y3 \times (Y3^2 - Y0^2) \times \tan\theta 3}{Y3^2 + Y0^2 \times \tan^2\theta 3} + \frac{Y1 \times (Y2 \times \tan\theta 2 + Y1 \times \tan\theta 1)}{Y1 - Y2 \times \tan\theta 1 \times \tan\theta 2} \quad (12)$$

A stop-band of the MMIC filter circuit according to the present embodiment can be obtained from the imaginary number part Im (Y)= ∞. Now, in order to be easily understood, if it is assumed that $\theta 1 = \theta 2 = \theta$, from the equation (12), the equation Im (Y)= ∞ holds when the electrical length θ satisfies the equation as follows:

$$\tan^2\theta = Y1/Y2 \ldots \quad (13)$$

and a frequency of which becomes an intermediate frequency fr of the stop-band. Accordingly, the center frequency fr is determined by the stubs 1a and 2a. If the characteristic admittances of the stubs 1a and 2a are selected to have a relation such that Y1<Y2, it is shown that $\tan^2\theta < 1$ and thus $\theta < 45°$, so that the total electrical length $(2 \times \theta)$ of the stubs 1a and 2a can be made shorter than ¼ wavelength (90°). While in the conventional example, the stub of ¼ wavelength is required at the center frequency fr of the stop-band, a stub length can be made shorter than ¼ wavelength according to the present embodiment.

In addition, in the range of tan $\theta 3 > 0$ (0°< $\theta 3$ < 90°), signs of the first and second terms of Im (Y) of the equation (12) are changed as shown in Table 1 depending on the relation between Y3 and Y0 (=0/02 mho).

TABLE 1

| Range of Frequency | Sign of the first half of Im (Y) | | Sign of the latter half of Im (Y) |
|---|---|---|---|
| | Y3 > Y0 | Y3 < Y0 | |
| Frequency < fr | + | − | + |
| Frequency = fr | + | − | (∞) |
| Frequency > fr | + | − | − |

What can be seen from Table 1 is that the imaginary number part Im (Y) changes in polarity at a turning point of the frequency fr depending on Y3. A sign of the latter half of the imaginary number part Im (Y) changes at the turning point of the frequency fr. On the other hand, the sign of the first half of the imaginary number part Im (Y) does not change in response to a change of the frequency. If the characteristic admittance is selected to have a relation such that Y3>Y0, the first half (sign +) and the latter half (sign −) of Im (Y) cancel with each other in a region where the frequency is higher than fr, so that Im (Y) promptly approaches 0. If selected to have a relation such that Y3<Y0, the first half (sign −) and the latter half (sign +) cancel with each other in a region where the frequency is lower than fr, so that Im (Y) rapidly approaches 0. Accordingly, while in the conventional example of FIG. 13, the transmission characteristics have frequency characteristics symmetrical to a stop-band (see FIG. 14), according to the present embodiment, the transmission characteristics have frequency characteristics asymmetrical to a stop-band due to an effect of the line 3a (an effect in the first half of the imaginary number part Im (Y)). On the other hand, in a frequency range wherein tan $\theta 3$ is small, from the equation (11) the real number part Re (Y) can be considered to be approximately equal to Y0. In addition, if the electrical length $\theta 3$ of the line 3a is selected such that tan $\theta 3 = Y3^2/Y0^2$ in the signal pass band, the equation Re (Y)=Y0 can be obtained, whereby the transmission loss in the MMIC filter circuit is reduced in a frequency region wherein an absolute value of Im (Y) is small. Therefore, the transmission loss in the signal pass band in the MMIC filter circuit in the signal pass band can be made less than that of the conventional example by setting Y3>Y0 when the signal pass band is on the higher frequency side than the stop-band (fs>fr) and Y3<Y0 when the signal pass band is on the lower frequency side than the stop-band (fs<fr).

Now, taking as a concrete example a case in which the signal pass band frequency is 11.7–12.2 GHz and the center frequency of the stop-band is 9.4 GHz, the present embodiment will be compared with the conventional example. Herein, a microstrip line is selected for a distributed constant line and GaAs is selected for a circuit substrate.

Figure 5:
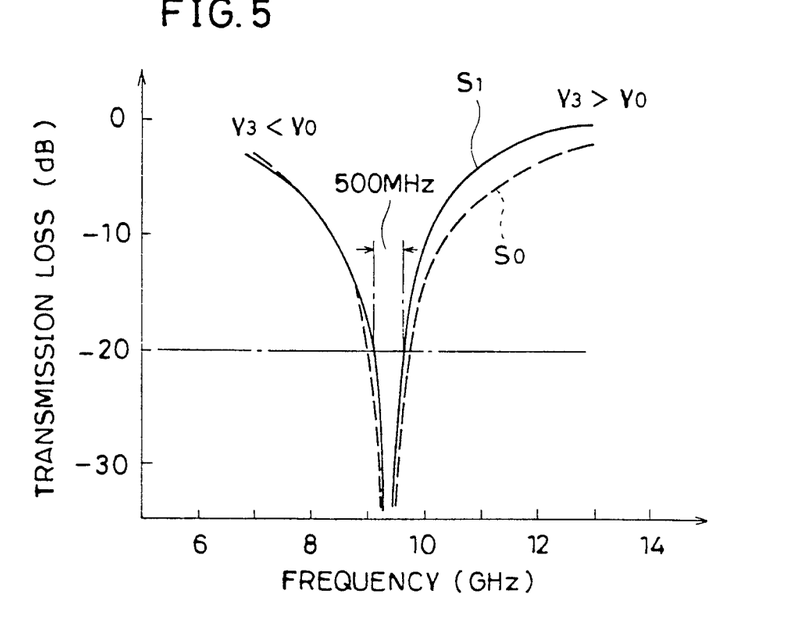
FIG. 5 is a diagram showing a comparison between, transmission characteristics of the third embodiment and transmission characteristics of a conventional example.

FIG. 5 shows a calculation result of a transmission loss in the MMIC filter circuit when the characteristic admittances of the lines 1a, 2a and 3a are set to be 0.013 mho, 0.033 mho and 0.033 mho, respectively and the physical lengths of the lines 1a, 2a and 3a are set to be 0.92 mm, 1.0 mm and 1.2 mm, respectively. In FIG. 5, SI denotes transmission loss characteristics of the present embodiment and SO denotes transmission loss characteristics of the conventional example.

According to the present embodiment, the transmission loss in the signal pass band (11.7–12.2 GHz) is about 1.5dB and a signal removal ratio of −20dB can be obtained in a band at about 500 MHz. Accordingly, in the embodiment of FIG. 4 the amount of the reduced transmission loss in the signal pass band can be increased by 2.5dB more than that in the conventional example. While the stop-band is made slightly narrower, it is not so different as that of the conventional example. In addition, when the signal pass band frequency is lower than the stop-band frequency, the same effect as that of FIG. 5 can be obtained by setting the characteristic admittances such that Y3<Y0.

Figure 6:
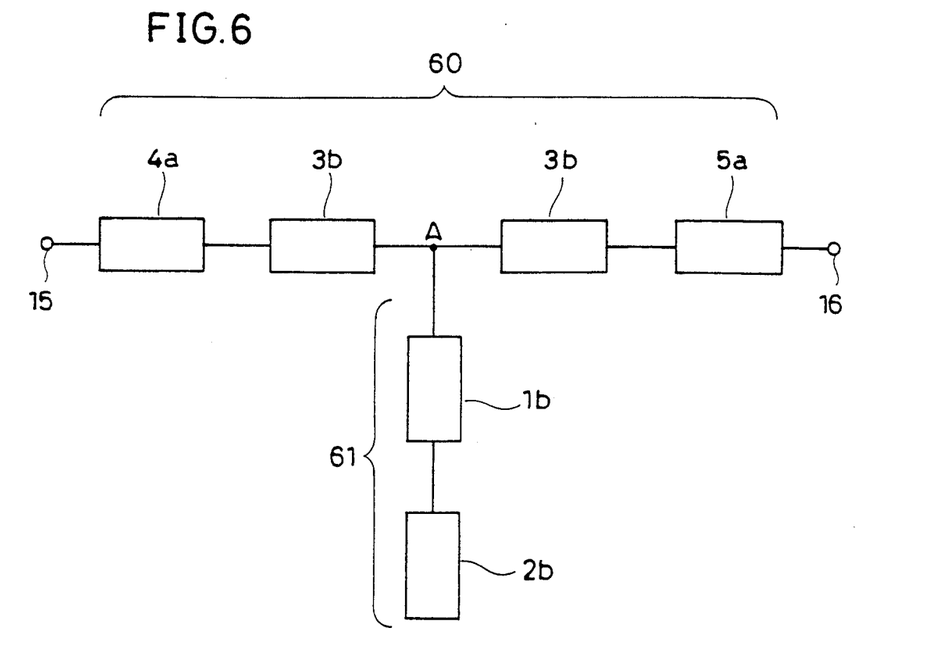
FIG. 6 is a circuit diagram of a filter according to a fourth embodiment of the present invention.

Now, FIG. 6 shows a fourth embodiment of the present invention. Referring to FIG. 6, this embodiment differs from that of FIG. 4 in that main lines 3b' and 3b are connected between the main lines 4a and 5a and the stubs are replaced with lines 1b and 2b. Characteristic admittances of the lines 1b, 2b, 3b and 3b' are denoted as Y1b, Y2b, Y3b and Y3b' respectively and electrical lengths thereof are denoted as $\theta 1b$, $\theta 2b$, $\theta 3b$ and $\theta 3b'$. A stop-band is determined by the lines 1b and 2b forming a stub, similarly to that in the above described embodiment. As in the above described embodiment in FIG. 4, by making Y 1b smaller than Y2b, $\theta 1b + \theta 2b$ becomes smaller than 90°, whereby a stub length can be made shorter than that of the conventional example. In addition, when the signal pass band frequency is higher than the stop-band frequency, by making both Y3b and Y3b' larger than Y0, a transmission loss in a signal pass band can be made less than that of the conventional example, and when the signal pass band frequency is lower than the stop-band frequency, by making both Y3b and Y3b' smaller than Y0, a transmission loss in the signal pass band can be made less than that of the conventional example.

Figure 7:
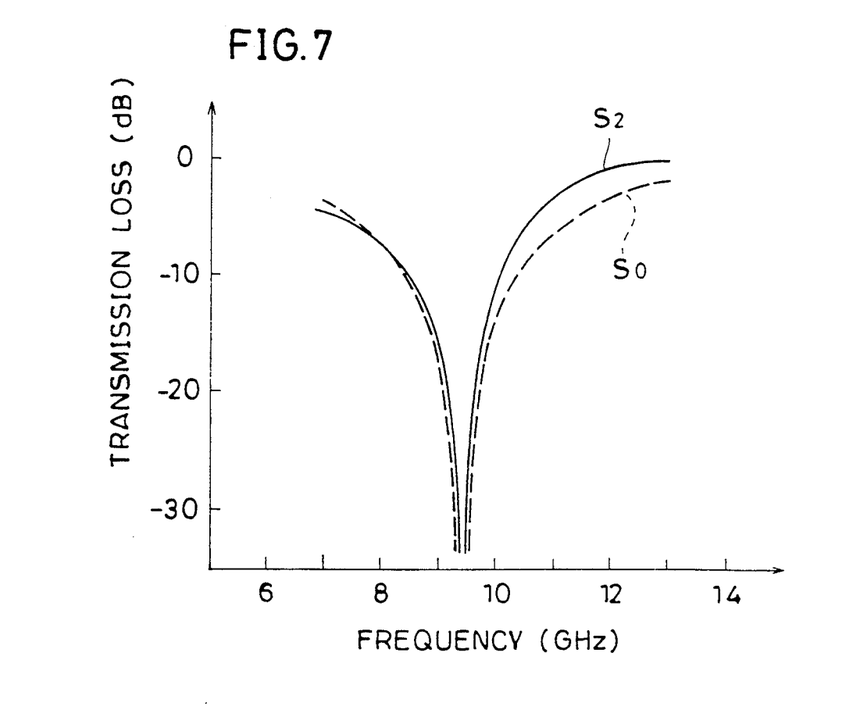
FIG. 7 is a diagram showing a comparison between transmission characteristics of the fourth embodiment and transmission characteristics of the conventional example.

Now, similarly to that in the embodiment of FIG. 4, taking as an example a case in which a signal pass band frequency is 11.7–12.2 GHz and an intermediate frequency of a stop-band is 9.4 GHz, FIG. 6 shows a calculation result of the transmission characteristics of the MMIC filter circuit (the line is formed by a microstrip line and a circuit substrate is formed by GaAs). FIG. 7 shows a calculation result of the transmission characteristics, supposing that a characteristic admittance of the line 1b is 0.013 mho, those of the lines 2b, 3b and 3b' are 0.033 mho and physical lengths of the respective lines are 0.92 mm, 1.05 mm, 1.0 mm and 1.0 mm, respectively. Referring to FIG. 7, S2 denotes the transmission characteristics of the embodiment shown in FIG. 6 and S0 denotes transmission characteristics of the conventional example. In the configuration of the embodiment shown in FIG. 7, a transmission loss in the signal pass band (11.7–12.2 GHz) is below 1dB and a band wherein a signal removal ratio of −20dB can be obtained is at about 500MHz. Accordingly, in the embodiment of FIG. 7, the amount of the reduced transmission loss in the signal pass band can be increased by 3.0dB more than that in the conventional example. While the stop-band is made slightly narrower, it is not so different from that of the conventional example. In addition, also when the signal pass band frequency is lower than the stop-band frequency, the same effect as that of FIG. 7 can be obtained by setting Y3b< Y0 and Y3c<Y0.

Figure 8:
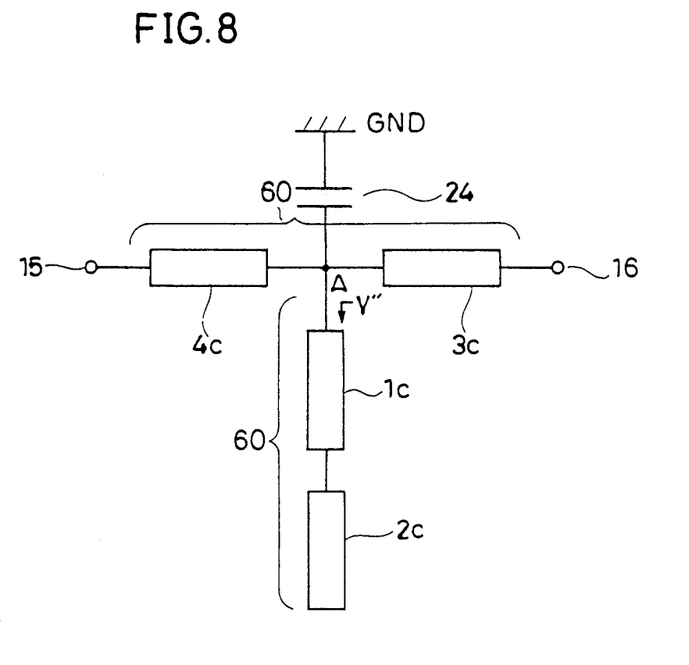
FIG. 8 is a circuit diagram of a filter according to a fifth embodiment of the present invention.

FIG. 8 is a circuit diagram of a filter according to a fifth embodiment of the present invention. Referring to the drawing, this filter differs from the above described filter of FIG. 4 in that the characteristic admittance of the first distributed constant line 60 discontinuously varies at the point A and a capacitor 24 is connected between the point A and the ground potential. The above-described first distributed constant line 60 includes a main line 4c connected to the input terminal 15 and a main line 5c connected to the output terminal 16. The above-described second distributed constant line 61 includes a line 1c connected to the node A and a line 2c having an open termination, which lines form the stub.

The main lines 4c and 3c are used for matching an input circuit (not shown) connected to the input terminal 15 with an output circuit (not shown) connected to the output terminal 16, respectively, and the lines are not necessarily factors in determining filter characteristics.

If the characteristic admittances of the lines 1c and 2c are represented as Y1c and Y2c, respectively, a relation there will be set as Y1c<Y2c.

While in the present embodiment, the characteristic admittances of the main lines 3c and 4c are 0.02 mho, they do not necessarily need to be 0.02 mho. By setting the characteristic admittances Y1c and Y2c of the stubs 1c and 2c as described above, the effect of attenuating microwave signals in a predetermined band can be obtained with a stub shorter than that of a conventional circuit structure.

An MMIC filter circuit according to the present embodiment will be described in more detail.

Figure 9:
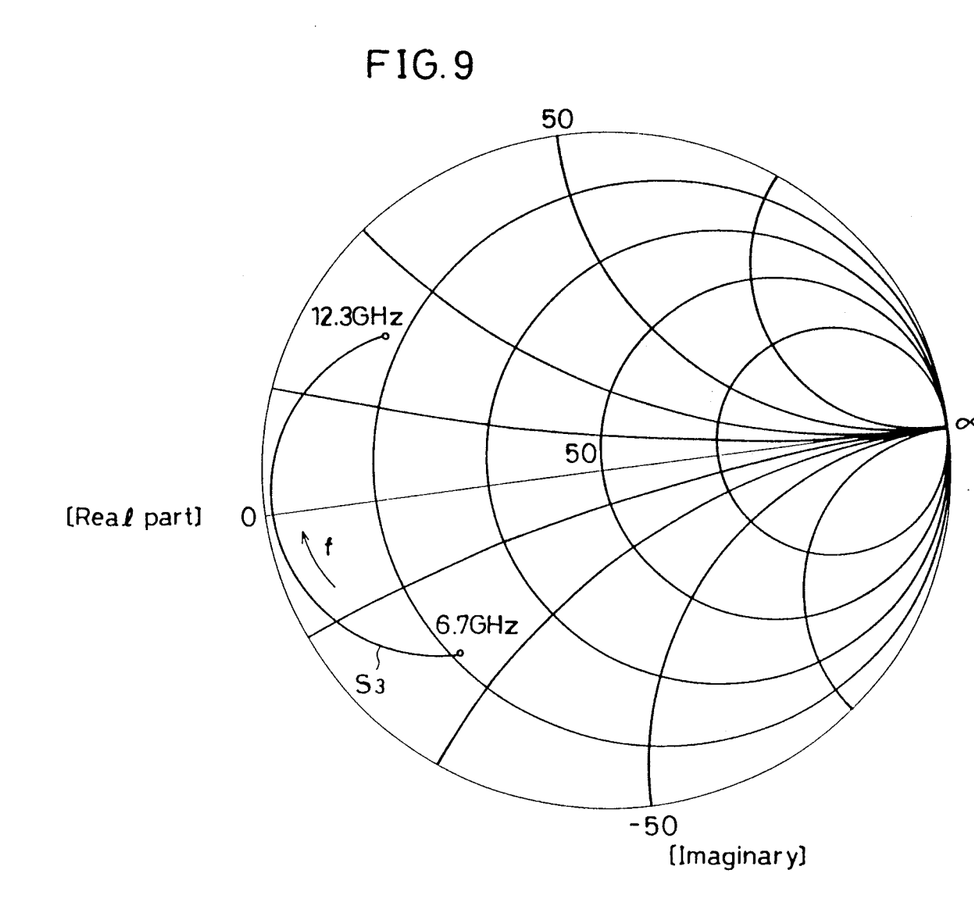
FIG. 9 is a frequency characteristic diagram of a reflection coefficient seen from a point A to a line 3c excluding a capacitor 24 in the third embodiment of the filter circuit.

In FIG. 9, the admittance Y" seen from the node (A) between the main line 3c and the stub 1c to the stub 1c will be represented, similarly to the above described equation (8) of the third embodiment, as follows:

$$Y'' = \frac{jY1c \times (Y2c \times \tan\theta2c + Y1c \times \tan\theta1c)}{Y1c - Y2c \times \tan\theta1c \times \tan\theta2c} \quad (14)$$

wherein $\theta1c$ and $\theta2c$ denote electrical lengths of the stubs 1c and 2c, respectively and it can be shown that, $$\theta n = 2 \times \pi \times ln/\lambda n, n=1, 2 \ldots \quad (15)$$

wherein ln and λn denote =physical length and a wavelength of a stub n (n=1, 2).

Accordingly, the admittance Y seen from the node A to the line 1c and 3c excluding the capacitor 24 in the drawing will be represented as follows:

$$Y = Y0 + Y'' = Re(Y) + Im(Y) \ldots \quad (16)$$

so that the real number part Re (Y) of Y=Y0=0.02 mho and the imaginary number part Im (Y)=Y". Accordingly, an intermediate frequency (fr) of a stop-band in the MMIC filter circuit of the above described embodiment can be obtained from the equation Im (Y)=∞.

In order to be easily understood, if it is supposed that $\theta1c = \theta2c = \theta$, from the equation (1), the equation Im (Y)=∞ holds at a frequency at which the electrical length θ satisfies the equation:

$$\tan^2\theta = Y1c/Y2c \ldots \quad (17)$$

so that the frequency becomes an intermediate frequency (fr) of the stop-band. Accordingly, the center frequency (fr) is determined by the characteristic admittances of the stubs 1c and 2c. Herein, if the characteristic admittances of the stubs 1c and 2c are selected such that Y1c<Y2c, $\tan^2\theta$ becomes smaller than 1, so that θ is smaller 45°, whereby a total electrical length (2 × θ) of the stubs 1c and 2c can be made smaller than 90°. Namely, while in the conventional example, a stub of ¼ wavelength is required at an intermediate frequency (fr) of stop-band in order to make an electrical length 90°, a stub length can be made shorter than the ¼ wavelength according to the present embodiment.

Figure 10:
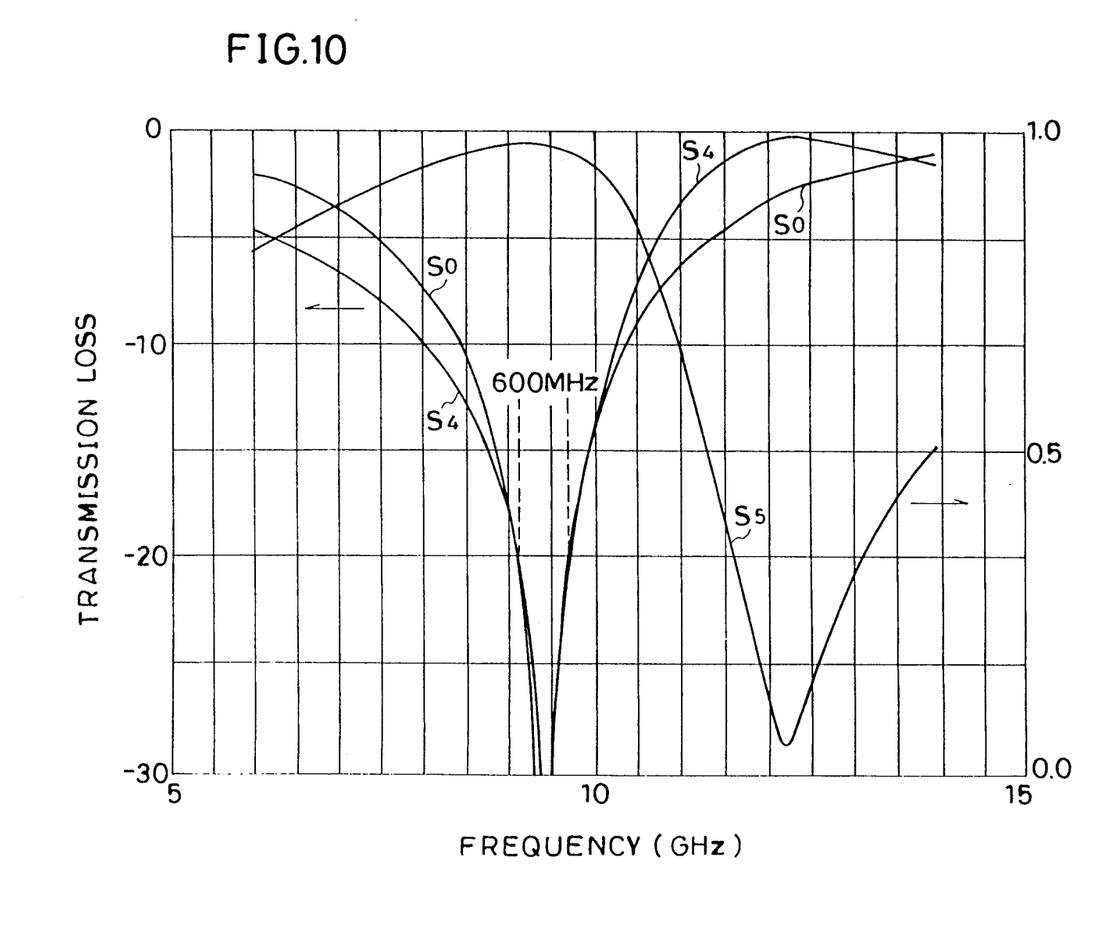
FIG. 10 is a diagram showing a comparison between the transmission characteristics and the reflection coefficient of the third embodiment and the transmission characteristics and a reflection coefficient of the conventional example.

The curve S3 of FIG. 9 shows a calculation result of frequency characteristics at the reflection coefficient Γ

$$\left(\Gamma = \frac{Y0 - Y''}{Y0 + Y''}\right)$$

can be calculated from the above-described equations (14)-(17)) seen from the node the lines 1c and 3c in the circuit excluding the capacitor 24 in FIG. 8, wherein a frequency is set to be 6.7-12.3 GHz. In this calculation, microstrip lines are used for the distributed constant lines 1c-4c and GaAs of 150 μm is used for a circuit substrate. In addition, it is assumed that the characteristic admittances of stubs 1c and 2c are 0.014 mho and 0.033 mho, respectively, and the physical lengths of the stubs 1c and 2c are 0.9 mm and 1.1 mm, respectively. As is clear from FIG. 9, since the reflection coefficient Γ draws a locus on a circle on which Y0 approximately equals 0.02 mho, in order to reduce loss in the pass band, it is effective to provide the capacitor 24 in parallel with the node A to move the admittance to the center. FIG. 10 shows a calculation result of the transmission characteristics and frequency characteristics of the input reflection coefficient of this filter circuit, wherein a value of the capacitor 24 is 0.7 of.

In FIG. 10, curves S4 and S5 denote the transmission characteristics and the input reflection coefficient of the present embodiment, respectively, and a curve S0 denotes the transmission characteristics of the conventional example. According to the present embodiment, the transmission loss in the signal pass band is below 1dB, and a band in which the signal removal ratio of −20dB can be obtained is at about 600 MHz. Hence, according to the present embodiment the amount of the reduced transmission loss in the signal pass band can be increased by as much as 3dB more than that in the conventional example, and an MMIC filter circuit can be realized using a stub (2.0 mm) shorter than a stub of 2.8 mm of the conventional example.

According to the above described third, fourth and fifth embodiments, a stub length can be made about 70% of that of the conventional example, which facilitates making a MMIC, and in addition, the amount of the reduced transmission loss in the signal pass band can be increased by 3dB more than that in the conventional example. While in the above described embodiments shown in FIGS. 4, 6 and 8, the circuit comprises one stub including 1c and 2c, two stubs may be used, so that it is possible to expand the stop-band by slightly varying the lengths of the two stubs and to increase a signal removal ratio by equalizing the length thereof. In addition, the stub does not necessarily need to be straight as shown in FIGS. 1, 4, 6 and 8, but it may be bent, for example, at the node between the lines 1 and 2. Besides, it is not limited to one point at which the characteristic admittance of the stub discontinuously varies, but it may vary at more than one point. In addition, while the value 0.02 mho of Y0 is commonly used, a circuit is designed with Y0 ≠ 0.02 mho in some cases. Even in those cases, the effect can be obtained by the present invention by selecting the relation between an admittance of each line and Y0 in FIGS. 1, 3, 4, 6, and 8 as described above. In the above described embodiments, while GaAs is used for a MMIC substrate, other semiconductor substrates than those made of InP or the like may be used and also an MIC can be formed by forming a microwave circuit on a dielectric substrate. In addition, while in the above described embodiments a microstrip line is used as a distributed constant line, a coplanar line or the like can be used and a combination of a microstrip line and a coplanar line can be also used. An interdigitalized capacitor, an MIM (Metal Insulated Metal) or the like can be used as a capacitor. In addition, since a stop-band is determined by a stub, a pass band can be changed by making a capacitor value variable without changing the stop-band.

Furthermore, the present invention can be applied to such microwave circuits comprising distributed constant circuits not only for a low noise amplifier but also for a mixer and an oscillator, and is also applicable not only to an MMIC but also to a conventional high breed circuit using a dielectric substrate.

As described in the foregoing, according to the present invention, a stub of a band-stop filter can be made shorter than that of the conventional example, whereby the making of a MMIC is facilitated. In addition, transmission loss in a signal pass band can be drastically reduced to facilitate designing of a high frequency circuit, resulting accelerating the making of the high frequency MMIC circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A microwave filter circuit having a noise removing frequency band, said filter circuit comprising
    a substrate;
    a distributed constant main line being formed on a surface of said substrate and having a characteristic admittance which varies discontinuously at at least one point;
    a distributed constant stub line being formed on said surface of said substrate and having a characteristic admittance which varies discontinuously at at least one point;
    one end of said stub line being connected to a selected point on said main line at which the characteristic admittance of the main line varies discontinuously; and
    another terminal end of said stub line being ungrounded, the characteristic admittance of said stub line at said terminal end being larger than the characteristic admittance of said stub line at said one end thereof.

2. A microwave filter circuit according to claim 1 and further including a capacitor connected between said selected point on said main line and a ground.

3. A microwave filter circuit according to claim 1 wherein said circuit is formed as a monolithic microwave integrated circuit.

* * * * *